US006093954A

United States Patent [19]

Yoshikuni

[11] Patent Number: 6,093,954

[45] Date of Patent: Jul. 25, 2000

[54] SEMICONDUCTOR DEVICE HAVING VARIABLE DELAY CIRCUIT HAVING MULTI-LAYERED SEMICONDUCTOR STRUCTURE

[75] Inventor: Hitoshi Yoshikuni, Tokyo, Japan

[73] Assignee: NEC Corporation, Tokyo, Japan

[21] Appl. No.: 09/146,955

[22] Filed: Sep. 4, 1998

[30] Foreign Application Priority Data

Sep. 4, 1997 [JP] Japan .................................... 9-239389

[51] Int. Cl.[7] ...................................................... H01L 29/00

[52] U.S. Cl. ............................................ 257/529; 257/537

[58] Field of Search .................................... 257/529, 536, 257/537

[56] References Cited

U.S. PATENT DOCUMENTS 5,128,745 7/1992 Takasu et al. .......................... 257/538
5,493,148 2/1996 Ohata et al. ............................ 257/529
5,682,049 10/1997 Nguyen .................................. 257/530

FOREIGN PATENT DOCUMENTS 5-75062 3/1993 Japan .

*Primary Examiner*—J. Carroll
*Attorney, Agent, or Firm*—Foley & Lardner

[57] ABSTRACT

A variable delay circuit has plural delay stages connected in series for providing delay time during signal propagation therethrough, and a high resistive delay signal line on a lower level of a multi-layered semiconductor structure and a low resistive breakable signal line on an upper level of the multi-layered semiconductor structure are connected in parallel between two nodes of each delay stage so as to change the total resistance of the delay stage; when a manufacturer decreases the delay time, the low resistive breakable signal line is broken, and the signal is propagated through the high resistive signal line instead of the low resistive breakable signal line.

11 Claims, 4 Drawing Sheets

31d 36a 36b 35b 35a 32 36
FROM INPUT NODE 31K
TO HIGH RESISTIVE SIGNAL LINE 31e & LOW RESISTIVE BREAKABLE LINE 31C
31a 31a 35c 31b 35d

SEMICONDUCTOR DEVICE HAVING VARIABLE DELAY CIRCUIT HAVING MULTI-LAYERED SEMICONDUCTOR STRUCTURE

FIELD OF THE INVENTION

This invention relates to a semiconductor device and, more particularly, to a semiconductor device such as, for example, a semiconductor dynamic random access memory device having a variable delay circuit.

DESCRIPTION OF THE RELATED ART

Various internal circuits form in combination the semiconductor dynamic random access memory device, and internal signals are propagated from one internal circuit to another through internal signal lines. An internal circuit requires time delay, and a delay circuit is inserted in the associated internal signal line. When a manufacturer redesigns the semiconductor dynamic random access memory device, the time delay to be required is not always equal, and a variable delay circuit is convenient, because the manufacturer does not need to newly design the photo-masks for the delay circuit.

A typical example of the variable delay circuit is disclosed in Japanese Patent Publication of Unexamined Application No. 5-75062. FIG. 1 illustrates the first prior art variable delay circuit incorporated in a semiconductor dynamic random access memory device disclosed in the Japanese Patent Publication of Unexamined Application No. 5-75062. The first prior art variable delay circuit comprises an inverter 1 supplied with an input signal Sin, a NOR gate 2 for producing an output signal Sout and delay circuits 3/4/5 connected in series between the inverter 1 and the NOR gate 2. Though not shown in FIG. 1, each of the delay circuits 3/4/5 is implemented by a series of inverters. The output nodes 3*a*/4*a*/5*a* of the delay circuits 3/4/5 are connected in parallel to the ground line GND, and breakable elements 6/7, 8/9 and 10/11 are connected between the output nodes 3*a*/4*a*/5*a* and the ground line GND. The input nodes of the NOR gate 2 are connected to nodes between the breakable elements 6/8/10 and the other breakable elements 7/9/11, respectively.

If the longest delay time is required, the manufacturer breaks the breakable elements 7/9/11, and leaves the other breakable elements 6/8/10 connected. The input signal Sin of inactive low level causes all the delay circuits 3/4/5 to keep the output nodes 3*a*/4*a*/5*a* at high level. With the output signals of the high level, the NOR gate 2 maintains the output signal Sout at the low level. When the input signal Sin is changed to the high level, the inverter 1 supplies the low level to the delay circuit 3. The low level is sequentially transferred from the delay circuit 3 to the delay circuit 5, and each of the delay circuits 3/4/5 introduces time delay into the propagation. For this reason, the low level reaches the input nodes of the NOR gate 2 at intervals. When all the input nodes of the NOR gate 2 are changed to the low level, the NOR gate 2 changes the output signal Sout to the high level. Thus, the first prior art variable delay circuit introduces the longest delay time between the input signal Sin and the output signal Sout.

If the manufacturer needs to shorten the delay time, the manufacturer selectively breaks the breakable elements 10/8 instead of the associated breakable elements 11/9. When the first prior art variable delay circuit is expected to introduce the shortest delay time, the manufacturer breaks the breakable elements 7/10/8, and leaves the breakable elements 6/9/11 connected. As a result, the ground level or the low level is supplied through the breakable elements 9/11 to the input nodes of the NOR gate 2 at all times. When the input signal Sin is changed to the high level, the inverter 1 supplies the low level to the delay circuit 3, and the delay circuit 3 introduces the delay time into the propagation from the input node to the output node 3*a*. When the delay circuit 3 changes the output node 3*a* to the low level, the NOR gate 2 changes the output signal Sout to the high level. Thus, the delay time is decreased to a third.

As will be understood, the manufacturer selectively breaks the breakable elements 6–11 so as to change the delay time, and the selective breakage is carried out by changing the photo-mask in the fabrication process for the semiconductor device.

FIG. 2 illustrates the second prior art variable delay circuit 20 incorporated in another semiconductor device. The second prior art variable delay circuit 20 is rather simple than the first prior art variable delay circuit. The second prior art variable delay circuit 20 is implemented by a signal line 21 and breakable elements 22/23/24. The signal line 21 is connected between an internal circuit 25 and another internal circuit 26, and the breakable elements 22/23/24 are connected in parallel between one half of the signal line 21 to the other half. For this reason, the breakable elements 22/23/24 provide bypassing paths, and decrease the total length of the signal line 21. The signal line 21 and the breakable elements 22/23/24 are patterned on a certain insulating layer of a semiconductor chip.

When the manufacturer requires the longest delay time, all the breakable elements 22/23/24 are broken. Then, the output signal S20 of the internal circuit 25 is propagated along the signal line 21, and the signal line 21 introduces the longest delay time. If the manufacturer needs to decrease the delay time, the manufacturer selectively leaves the breakable element or elements 22/23/24 connected, and the non-broken elements 22/23/24 decrease the total length of the signal propagation path. As a result, the delay time is deceased.

However, the first prior art variable delay circuit can not precisely adjust the delay time to the design specification. As described hereinbefore, the series combination of inverters form each delay circuit 3/4/5, and the inverter consumes several nanoseconds to change the output level. However, an advanced high-speed semiconductor device requires time regulation of the order of hundreds picoseconds, and the first prior art variable delay circuit is not appropriate for the advanced high-speed semiconductor device.

The second prior art variable delay circuit can vary the delay time by hundreds picoseconds, and is available for the advanced semiconductor device. However, the signal line 21 consumes a large amount of real estate, and is not appropriate for a semiconductor ultra large scale integrated circuit device.

SUMMARY OF THE INVENTION

It is therefore an important object of the present invention to provide a variable delay circuit, which occupies narrow real estate and varies the delay time by hundreds picoseconds.

To accomplish the object, the present invention proposes to form a resistive line into a multi-layered structure.

In accordance with one aspect of the present invention, there is provided a variable delay circuit fabricated on a substrate comprising a plurality of delay stages connected in series between a signal input node and a signal output node for introducing a delay time into propagation of a signal, and each of said plurality of delay stages provides a signal path and includes an input node connected to one end of the signal path, an output node connected to the other end of the signal path, a first signal line forming a part of the signal, a second signal line connected to the first signal line and covered with an insulating layer over the substrate and a breakable signal line different in resistance from said second signal line, connected in parallel to the second signal line for providing another part of the signal path and formed on the insulating layer so as to be disconnected from the first signal line when the second signal line is caused to serve as the another of the signal path.

BRIEF DESCRIPTION OF THE DRAWINGS

The features and advantages of the variable delay circuit will be more clearly understood from the following description taken in conjunction with the accompanying drawings in which.

DESCRIPTION OF THE PREFERRED EMBODIMENT

Figure 1:
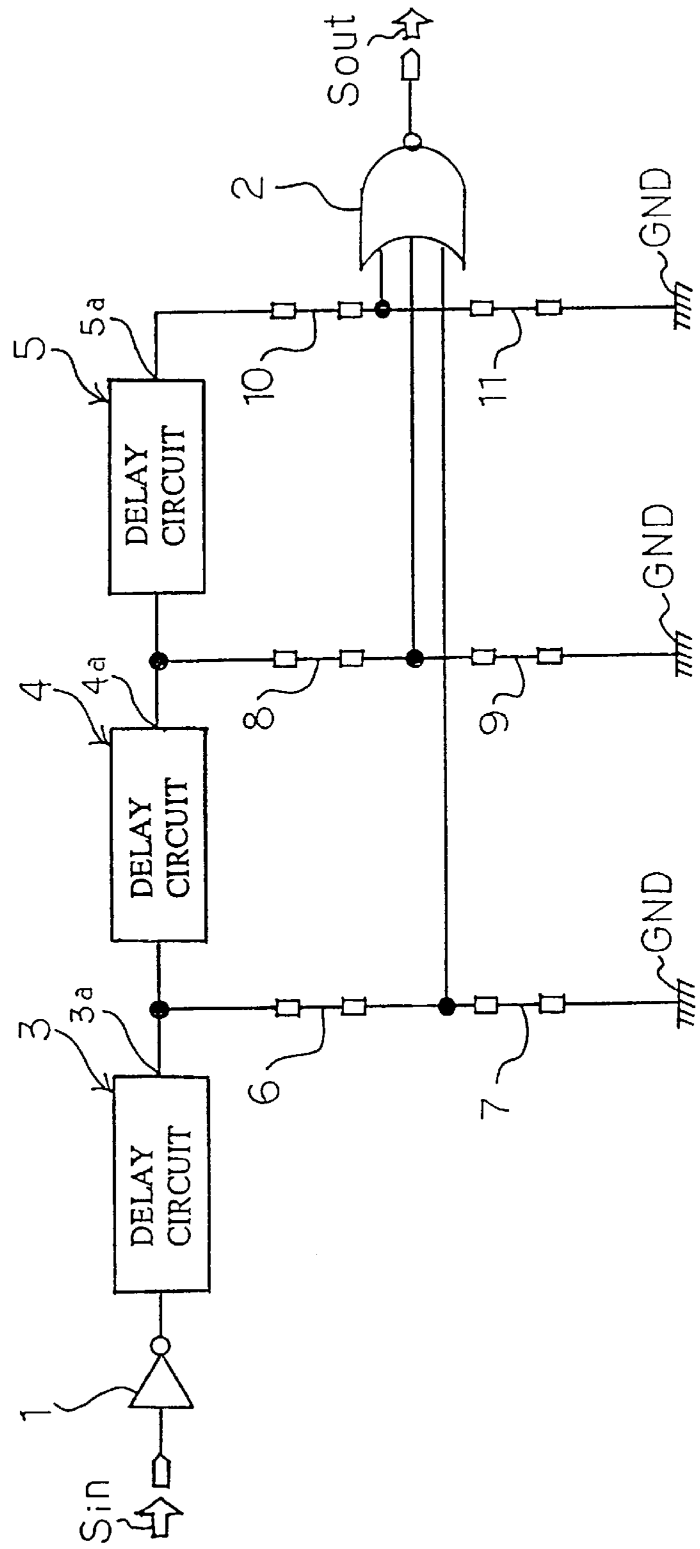
FIG. 1 is a circuit diagram showing the configuration of the first prior art variable delay circuit.
Figure 2:
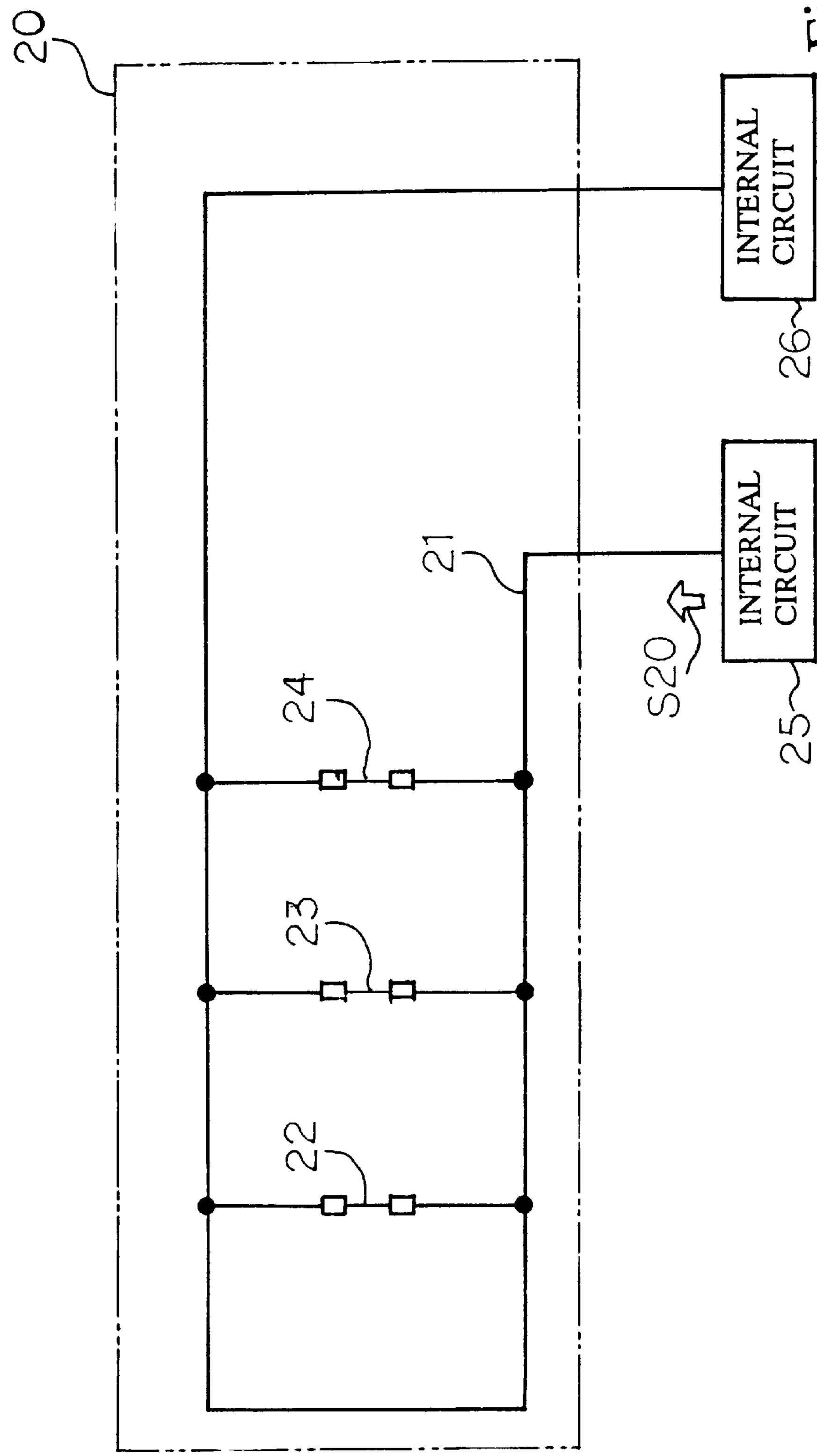
FIG. 2 is a circuit diagram showing the configuration of the second prior art variable delay circuit.
Figure 3:
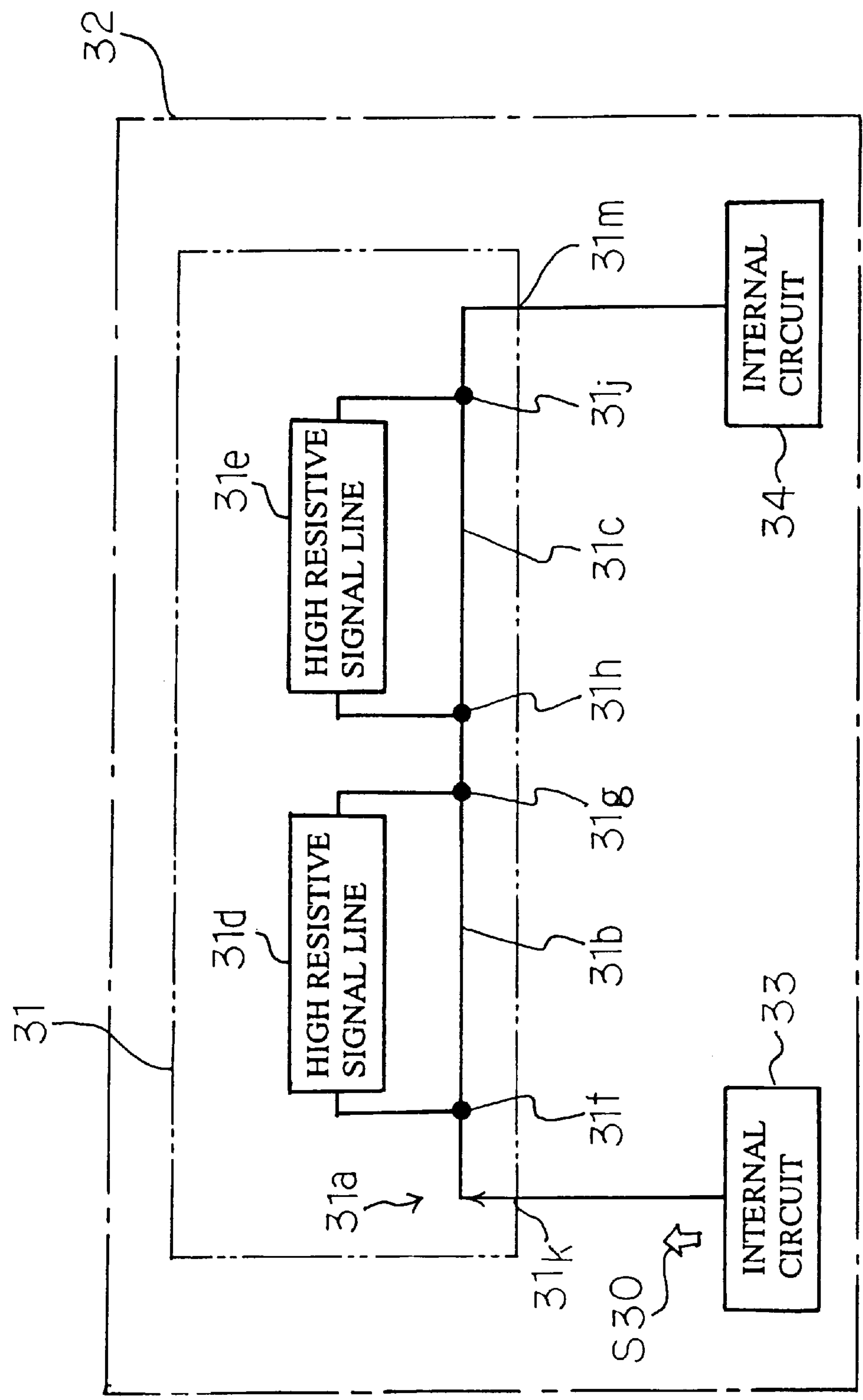
FIG. 3 is a circuit diagram showing the configuration of a variable delay circuit according to the present invention.

Referring to FIG. 3 of the drawings, a variable delay circuit 31 is integrated on a semiconductor substrate 32 together with other internal circuits 33/34. In this instance, the variable delay circuit 31 and the internal circuits 33/34 form parts of a semiconductor dynamic random access memory device. The variable delay circuit 31 comprises a low resistive signal line 31*a*, low resistive breakable lines 31*b*/31*c* inserted into the low resistive signal line 31*a* and high resistive signal lines 31*d*/31*e* connected in parallel to the low resistive breakable lines 31*b*/31*c*. Thus, the low resistive breakable line 31*b* and the high resistive signal line 31*d* are connected in parallel between nodes 31*f* and 31*g*, and the other low resistive breakable line 31*c* and the high resistive signal line 31*e* are connected in parallel between nodes 31*h* and 31*j*. The high resistive signal lines 31*d*/31*e* are larger in resistance than the low resistive breakable lines 31*b*/31*c*. For this reason, the total resistance along the propagation path between the internal circuits 33 and 34 is varied depending upon selective breakage of the low resistive breakable lines 31*b*/31*c*. As a result, the manufacturer can vary delay time introduced by the variable delay circuit 31 depending upon the selective breakage of the low resistive breakable lines 31*b*/31*c*, and the variable delay circuit 31 introduces the delay time into the propagation of a signal S30 from an input node 31*k* and an output node 31*m*. In this instance, the high resistive signal line 31*d*, the low resistive breakable line 31*b*/31*c* and a part of the low resistive signal line 31*a* as a whole constitute a delay stage.

The variable delay circuit 31 has a multi-layered structure over the semiconductor substrate 32. The low resistive signal line 31*a* and the low resistive breakable lines 31*b*/31*c* are formed on an upper level of the multi-layered structure, and the high resistive signal lines 31*d*/31*e* are formed on a lower level of the multi-layered structure. For this reason, the variable delay circuit 31 occupies an area narrower than that of the second prior art variable delay circuit. Moreover, since the low resistive breakable lines 31*b*/31*c* are formed on the upper level, the manufacturer easily breaks the low resistive breakable lines 31*b*/31*c*.

Figure 4:
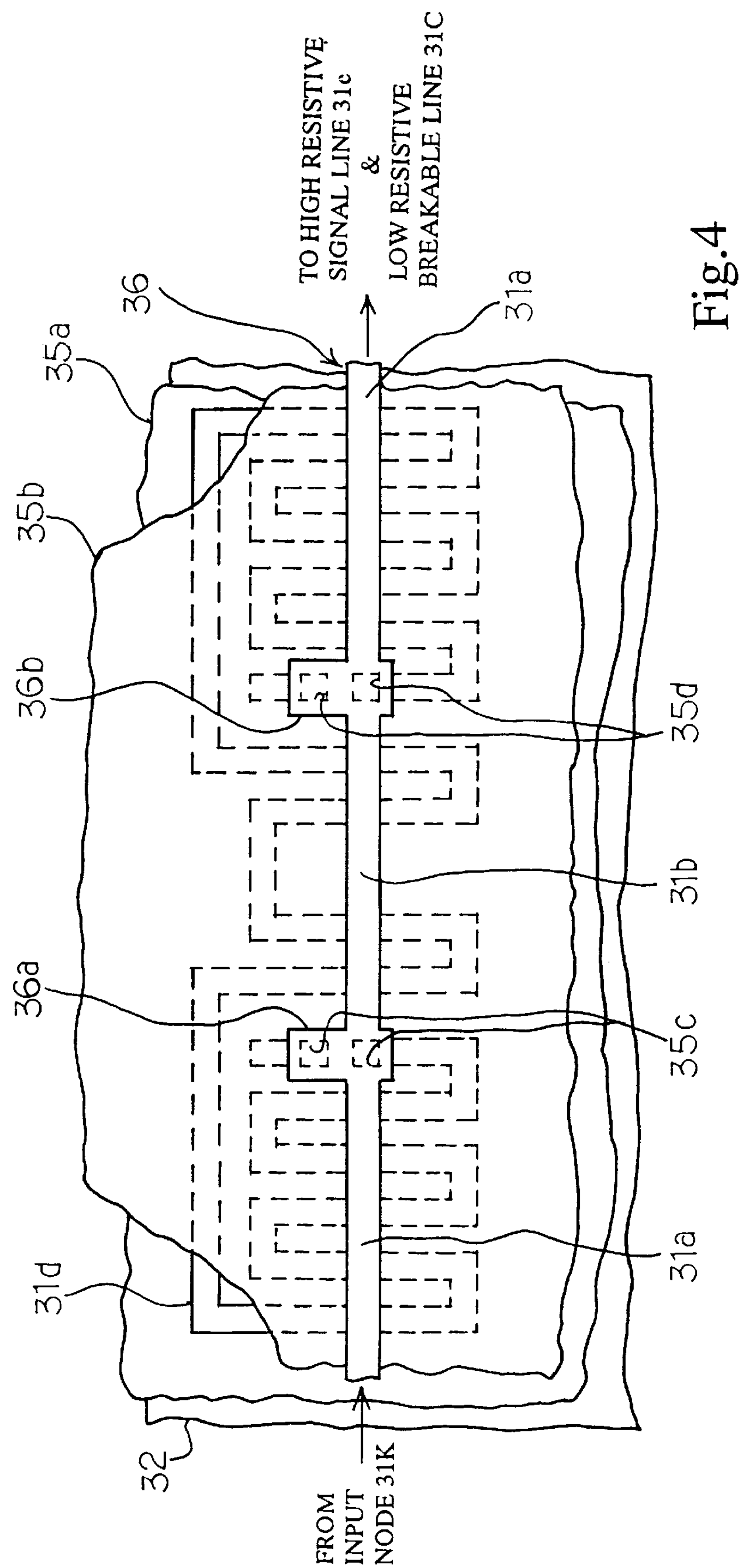
FIG. 4 is a plane view showing a three dimensional layout of the variable delay circuit.

The multi-layer structure is shown in FIG. 4 for a part of the low resistive signal line 31*a*, the low resistive breakable line 31*b* and the high resistive signal line 31*d*. The other part of the low resistive signal line 31*a*, the low resistive breakable line 31*b* and the high resistive signal line 31*d* have the similar structure to that shown in FIG. 4.

The high resistive signal line 31*d* is essentially formed of tungsten, and is multiply bent on a lower insulating layer 35*a* so as to increase the length. The high resistive signal line 31*d* is covered with an upper insulating layer 35*b*, and an aluminum strip 36 extends on the upper insulating layer 35*b*. The conductive strip 36 may be formed of aluminum alloy or other conductive material. The aluminum strip 36 partially serves as the low resistive signal line 31*a*, and partially serves as the low resistive breakable line 31*b*. The aluminum strip 36 has wide portions 36*a*/36*b* on both sides of the low resistive breakable line 31*b*. Two pairs of contact holes 35*c*/35*d* are formed in the upper insulating layer 35*b*, and the wide portions 36*a*/36*b* are connected to both ends of the high resistive signal line 31*d* through conductive pieces in the pairs of contact holes 35*c*/35*d*, respectively. Thus, the conductive pieces in the two pairs of contact holes 35*c*/35*d* serve as the nodes 31*f*/31*g* and 31*h*/31*j*.

The low resistive breakable lines 31*b*/31*c* are selectively broken by changing a photo-mask for patterning an aluminum layer into the aluminum strip 36. The low resistive breakable lines 31*b*/31*c* are formed on the insulating layer 35*b*, and the manufacturer varies the delay time by changing only one photo-mask. This means that the manufacturer uses the other photomasks for the high resistive signal lines 31*d*/31*e* and the contact holes 35*c* /35*d* regardless of the delay time. Thus, the low resistive breakable lines 31*b*/31*c* on the upper level are desirable for the manufacturer. The manufacturer varies the delay time as follow. If the internal circuit 34 requires the longest delay time, the manufacturer breaks both low resistive breakable lines 31*b*/31*c*. In this situation, the signal S30 is propagated from the low resistive signal line 31*a* through the conductive pieces in the pair of contact holes 35*c* to the high resistive signal line 31*d*, and the signal S30 in turn is propagated from the high resistive signal line 31*d* through the conductive pieces in the contact holes 35*d* to the low resistive signal line 31*a*. The signal S30 is transferred from the low resistive signal line 31*a* through the node 31*h* to the high resistive signal line 31*e*, and returns through the node 31*j* to the low resistive signal line 31*a*. The signal S30 is forced to pass the high resistive signal lines 31*d*/31*e*, and the delay time is maximized. When the manufacturer minimizes the delay time, the low resistive breakable lines 31*b*/31*c* are not broken, and the signal S30 simply pass the low-resistive signal line 31*a* and the low resistive breakable lines 31*b*/31*c*. The resistance along the signal propagation path and, accordingly, the delay time minimized. When the manufacturer wants to regulate the delay to intermediate delay time, the manufacturer breaks one of the high resistive signal lines 31*d*/31*e*, and the other is left non-broken. As a result, the signal delay is regulated to certain delay time between the maximum delay time and the minimum delay time.

As will be appreciated from the foregoing description, the low resistive signal line 31*a* and either high or low resistive lines introduce the time delay, and the selective usage between the high resistive signal lines 31*d*/31*e* and the low resistive breakable lines 31_b_/31_c_ results in variation of delay time of the order of hundreds picoseconds. Thus, the variable delay circuit according to the present invention is available for the advanced high-speed semiconductor integrated circuit device.

Moreover, the variable delay circuit according to the present invention has the multi-layered semiconductor structure, and occupies relatively narrow area. The waved high resistive signal lines 31_d_/31_e_ make the area further narrower.

Finally, the low resistive breakable lines 31_b_/31_c_ on the upper level allow the manufacturer to use the other photo masks regardless of the delay time to be required, and make the fabrication process simple and production cost reduced.

Although a particular embodiment of the present invention has been shown and described, it will be apparent to those skilled in the art that various changes and modifications may be made without departing from the spirit and scope of the present invention.

For example, the low resistive lines and the high resistive lines may be formed of different kinds of conductive material. However, if the high resistive line 31_d_/31_e_ and the low resistive breakable lines 31_b_/31_c_ are widely different in length, they may be formed of same conductive material. If the high resistive signal lines 31_d_/31_e_ are formed of conductive material larger in resistivity than the tungsten, the manufacturer can make the high resistive signal lines 31_d_/31_e_ short.

The high resistive signal lines 31_d_/31_e_ are equal in length to one another, or are different in length from each other. If the high resistive signal lines 31_d_/31_e_ are different in length, the manufacturer precisely adjust the signal delay to a target time by selectively breaking the high resistive signal lines 31_d_/31_e_.

A variable delay circuit according to the present invention may have more than two pairs of high resistive signal line/low resistive breakable line, and more than two-layered structure.

The present invention does not limit the high resistive signal lines 31_d_/31_e_ to the waved configuration. Any pattern such as, for example, a spiral configuration may be used for the high resistive signal lines 31_d_/31_e_.

The low resistive signal line 31_a_ may be formed on the same level as the high resistive signal line.

Finally, the variable delay circuit according to the present invention is never limited to a semiconductor dynamic random access memory device, and the semiconductor integrated circuit device may be fabricated on an insulating substrate.

What is claimed is:

1. A variable delay circuit fabricated on a substrate comprising a plurality of delay stages connected in series between a signal input node and a signal output node for introducing a delay time into propagation of a signal, each of said plurality of delay stages providing a signal path and including an input node connected to one end of said signal path, an output node connected to the other end of said signal path, a first signal line forming a part of said signal, a second signal line connected to said first signal line and covered with an insulating layer over said substrate, and a breakable signal line different in resistance from said second signal line, connected in parallel to said second signal line for providing another part of said signal path and formed on said insulating layer so as to be disconnected from said first signal line when said second signal line is caused to serve as said another of said signal path.

2. The variable delay circuit as set forth in claim 1, in which said first signal line is formed on said insulating layer, and is connected to said second signal line through conductive pieces in contact holes formed in said insulating layer.

3. The variable delay circuit as set forth in claim 2, in which said first signal line has a first sub-signal line connected between said input node and one of said contact holes and a second sub-signal line connected between the other of said contact hole and said output node, and said breakable signal line is connected between said first sub-signal line and said second sub-signal line.

4. The variable delay circuit as set forth in claim 2, in which said second signal line is waved between said contact holes.

5. The variable delay circuit as set forth in claim 2, in which said second signal line is waved between said contact holes, and said breakable signal line straightly extends between said contact holes.

6. The variable delay circuit as set forth in claim 5, in which said breakable signal line is part of a conductive strip extending on said insulating layer, and said first signal line is remaining part of said conductive strip.

7. The variable delay circuit as set forth in claim 6, in which said conductive strip is essentially formed of aluminum, and said second signal line is essentially formed of tungsten.

8. The variable delay circuit as set forth in claim 1, in which said second signal line is different in resistivity from said breakable signal line.

9. The variable delay circuit as set forth in claim 8, in which said second signal line is essentially formed of tungsten, and said breakable signal line is essentially formed of aluminum.

10. The variable delay circuit as set forth in claim 1, in which said second signal line is different in length from said breakable signal line.

11. The variable delay circuit as set forth in claim 10, in which said second signal line is longer than said breakable signal line.

* * * * *